United States Patent [19]

Tsuji et al.

[11] Patent Number: 5,930,603
[45] Date of Patent: Jul. 27, 1999

[54] METHOD FOR PRODUCING A SEMICONDUCTOR DEVICE

[75] Inventors: Kazuto Tsuji; Yoshiyuki Yoneda; Seiichi Orimo; Ryuji Nomoto; Masanori Onodera; Hideharu Sakoda, all of Kawasaki, Japan

[73] Assignee: Fujitsu Limited, Kanagawa, Japan

[21] Appl. No.: 08/863,280

[22] Filed: May 27, 1997

[30] Foreign Application Priority Data

Dec. 2, 1996 [JP] Japan .................................. 8-321973

[51] Int. Cl.⁶ .......................... H01L 21/288; H01L 21/56; H01L 21/60
[52] U.S. Cl. ...................... 438/127; 438/616; 228/180.22
[58] Field of Search ...................... 438/616, 127, 438/FOR 343, FOR 371; 228/180, 22; 257/737, 738

[56] References Cited

U.S. PATENT DOCUMENTS

| | | |
|---|---|---|
| 3,719,981 | 3/1973 | Steitz . |
| 5,219,117 | 6/1993 | Lin . |
| 5,381,848 | 1/1995 | Trabucco . |
| 5,607,099 | 3/1997 | Yeh et al. . |
| 5,643,831 | 7/1997 | Ochiai et al. . |
| 5,829,668 | 11/1998 | George et al. . |

Primary Examiner—David Graybill
Attorney, Agent, or Firm—Armstrong, Westerman, Hattori, McLeland & Naughton

[57] ABSTRACT

A method for producing a semiconductor device includes steps of: a) a positioning board forming process in which concave portions, each of which is located at a position corresponding to a position of a respective projecting electrode of a semiconductor device, and first positioning portions, which are used for determining a position of a sealing resin with respect to the projecting electrode, are integrally formed on a flat-plate member so as to form a positioning board; b) a filling process in which an electrode material for forming the projecting electrode is filled in the concave portions formed on the positioning board; c) a bonding process in which a composite board is formed by mounting a circuit board on the positioning board so as to bond each of the electrode material filled in the concave portions to the circuit board; d) a sealing resin forming process in which a mold having a cavity for forming a sealing resin and second positioning portions for determining a position of the positioning board with respect to the cavity is fixed to the composite board in a state that the position of the positioning board is determined with respect to the cavity by engaging the first positioning portions with the respective second positioning portions, and resin is filled in the cavity so as to form the sealing resin, and e) a positioning board removing process in which the positioning board is removed.

10 Claims, 7 Drawing Sheets ( ETCHING )

METHOD FOR PRODUCING A SEMICONDUCTOR DEVICE

BACKGROUND OF THE INVENTION

The present invention generally relates to semiconductor devices and methods for producing semiconductor devices, and particularly, to a semiconductor device including projecting electrodes and a method for producing such semiconductor devices.

Recently, reductions in size, weight and cost are highly demanded for portable electronic devices. Accordingly, semiconductor devices which are used for such portable electronic devices have been greatly reduced in size, weight and cost.

Also, there is a tendency that a pitch between each of outer connection terminals of a semiconductor device is narrowed in accordance with the size reduction of the semiconductor device. For this reason, projecting electrodes such as solder bumps have been adapted as an outer terminal structure which is capable of realizing a fine pitch of the outer connection terminals.

On the other hand, it is necessary to carry out a positioning operation of a projecting electrode and a testing socket with high accuracy when a semiconductor device including such finely pitched electrodes is tested. Likewise, it is required to precisely perform a positioning operation between a projecting electrode and an electrode provided on a mounting board when the semiconductor device having the above-mentioned finely pitched electrodes is mounted.

As a structure of the semiconductor device including the projecting electrodes, a ball grid array (BGA) has often been adapted these days. In the semiconductor device having the BGA structure, a semiconductor element is mounted on a surface of a ceramic multi-layer circuit board or an organic type multi-layer circuit board and a plurality of solder bumps, which are the projecting electrodes, are formed on the other side of the board.

The above-mentioned semiconductor element and the solder bumps are electrically connected via an electrode portion, which is formed on the surface of the multi-layer circuit board and is wire-bonded or flip-chip bonded to the semiconductor element, and inner electrodes, which are formed in the multi-layer circuit board so as to connect the electrode portion and the solder bumps.

In addition, a sealing resin is provided on the surface of the circuit board so as to seal and protect the semiconductor element, wires and so on.

Now, in order to produce the above-mentioned BGA type semiconductor device, a semiconductor element is firstly mounted on the surface of a circuit board and the semiconductor element is electrically connected to an electrode portion formed on the circuit board using such a method as a wire-bonding method. Then, a sealing resin is provided so as to cover the semiconductor element mounted on the circuit board. Methods such as a mold method or a potting method may be used for the above-mentioned purpose. After the completion of the above procedure, solder bumps are formed on the back of the circuit board.

In the above procedure, in order to achieve a fine pitch of the projecting electrodes of the BGA type semiconductor device, it is necessary to carry out a positioning operation with high accuracy when testing or mounting the semiconductor device. That is, in the testing of the semiconductor device, for example, an edge of the circuit board is made to contact the inner surface of an IC socket so as to determine the positional relationship between the projecting electrodes of the semiconductor device and the IC socket.

Also, when the semiconductor device is mounted on a mounting board, a standard position which is set at a predetermined position of the mounting board and the edge of the circuit board are recognized by a pictured image and the positioning operation is carried out based on the position of the edge of the circuit board and the predetermined standard position.

However, in the above-mentioned method in which the circuit board of the semiconductor device is used as a base of the positioning operation, it is required that each of the solder bumps (projecting electrodes) be accurately formed at a predetermined position. That is, if the accuracy of the position of each of the solder bumps with respect to the circuit board is low, the position of the solder bumps with respect to the IC socket or the mounting board is shifted even if the circuit board is accurately positioned with respect to the IC socket or the mounting board.

Thus, it is necessary to form each of the solder bumps accurately at a respective predetermined position with respective to the circuit board. Using the conventional method, however, it is difficult to improve the positional accuracy of the solder bumps relative to the circuit board. One of the reasons for this is that a thermal expansion coefficient of an organic material, which is often used for forming the circuit board, is generally high. That is, since a number of heating processes are present in the manufacturing process of the semiconductor device, the size of the circuit board is affected by the heat and it is difficult to maintain its size accuracy.

Another reason for the above is related to an error generated when the solder bumps are formed. That is, since the solder has to be melted when solder bumps are formed on the circuit board, uncertain factors (which cause the error) such as surface tension and wettability are involved in the formation and they lower the accuracy.

In order to solve the above problem, it is a consideration to set a standard position based on the formation position of the solder bumps after the solder bumps are formed. However, in the conventional methods, it is difficult to set a standard position after the formation of the solder bumps since the solder bumps are formed after a semiconductor element, wires, sealing resin and so on are provided with the circuit board.

SUMMARY OF THE INVENTION

It is a general object of this invention to provide a semiconductor device and a method for producing semiconductor devices in which the above-mentioned problems are eliminated.

A more specific object of the present invention is to provide a method for producing semiconductor devices in which a positioning operation of a semiconductor device with respect to, for instance, an IC socket or a mounting board may be performed with high accuracy.

It is another object of the present invention to provide a semiconductor device which may be produced by the above method for producing the semiconductor device.

The objects described above are achieved by a method for producing a semiconductor device comprising: a) a positioning board forming process in which concave portions, each of which is located at a position corresponding to a position of a respective projecting electrode of a semiconductor device, and first positioning portions, which are used for determining a position of a sealing resin with respect to the projecting electrode, are integrally formed on a flat-plate member so as to form a positioning board; b) a filling process in which an electrode material for forming the projecting electrode is filled in the concave portions formed on the positioning board; c) a bonding process in which a composite board is formed by mounting a circuit board on the positioning board so as to bond each of the electrode material filled in the concave portions to the circuit board; d) a sealing resin forming process in which a mold having a cavity for forming a sealing resin and second positioning portions for determining a position of the positioning board with respect to the cavity is fixed to the composite board in a state that the position of the positioning board is determined with respect to the cavity by engaging the first positioning portions with the respective second positioning portions, and resin is filled in the cavity so as to form the sealing resin, and e) a positioning board removing process in which the positioning board is removed.

According to the above method for producing a semiconductor device, since the concave portions, each of which is located at a position corresponding to the position of a respective projecting electrode, and the first positioning portions, which are used for determining the position of the sealing resin with respect to the projecting electrode, are integrally formed on the flat-plate member and the positioning board is produced in the positioning board forming process, it is possible to improve a relative positional accuracy between the concave portions and the first positioning portions.

Also, since the electrode material is filled in the concave portions formed on the positioning board in the filling process, the electrode material is provided at the positions corresponding to the positions of the projecting electrodes.

Moreover, the composite board in which the circuit board and the positioning board are combined together is formed by connecting the electrode material to the circuit board in the bonding process. The electrode material becomes the projecting electrodes when bonded to the circuit board. Since the positions of the electrode material are transferred to the circuit board in a state that they are determined by the positioning board, it is possible to accurately form the projecting electrodes at the respective positions regardless of the accuracy of the circuit board.

Further, in the sealing resin forming process, the mold having the second positioning portions for determining the position of the positioning board with respect to the cavity is fixed to the composite board in a state that the position of the positioning board is determined with respect to the cavity by engaging the first positioning portions with the respective second positioning portions. Then, the resin is filled in the cavity to form the sealing resin.

By engaging the first positioning portions with the respective second positioning portions, therefore, the position of the cavity (i.e., the sealing resin) with respect to the positioning board may be determined with high accuracy. Also, the positions of the projecting electrodes formed on the circuit board may be accurately located at the respective predetermined positions by passing through the positioning board forming process and the bonding process.

Thus, the position of the cavity (i.e., the sealing resin) with respect to the projecting electrodes may also be determined highly accurately by engaging the first positioning portions with the respective second positioning portions. That is, the position of the sealing resin relative to the projecting electrodes may be accurately defined regardless of the circuit board. Accordingly, it becomes possible to determine the positions of the projecting electrodes based on the side surfaces of the sealing resin when a semiconductor device produced in accordance with the above method is fixed to, for instance, an IC socket or a mounting board, and hence the position of the semiconductor device may be determined with high accuracy.

Finally, the positioning board is removed in the positioning board removing process and the projecting electrodes are exposed so that the processes for manufacturing the semiconductor device may be completed.

The objects described above are also achieved by the method for producing a semiconductor device further comprising: a metal-film-of-different-materials forming process, which is performed after the positioning board forming process and before the filling process, in which a single-layer metal film made of material(s) different from the material(s) used for the projecting electrodes is formed in the concave portions.

The objects described above are also achieved by the method for producing a semiconductor device further comprising: a metal-film-of-different-materials forming process, which is performed after the positioning board forming process and before the filling process, in which a multi-layer metal film formed of materials different from the material(s) used for the projecting electrode is formed in the concave portions.

According to the above method for producing a semiconductor device, the single-layer or multi-layer metal film made of different materials from the projecting electrodes is formed on the surface of each of the projecting electrodes after the completion of the positioning board removing process. Thus, it is possible to protect and improve the bonding property of the projecting electrodes by the metal film.

The objects described above are also achieved by the method for producing a semiconductor device, wherein solder paste is used for the electrode material and the solder paste is filled in the concave portions using a squeegee in the filling process, and when the solder paste is filled in the concave portions using the squeegee, a spacer member having openings, each of which is located at a position corresponding to the position of a respective one of the concave portions, is provided on the positioning board and the solder paste is filled in the concave portions via the spacer member.

According to the above method for producing a semiconductor device, since the spacer member is provided on the positioning board and the solder paste is filled in the concave portions via the openings of the spacer member, it is possible to fill a substantially larger amount of the solder paste in the respective concave portions. This is important since the solder paste is comprised of, for instance, organic flux in which solder particles are present and when the solder paste is heated in the bonding process, the flux is evaporated and the volume of the solder paste is reduced. Thus, there is a danger that a space or a void is generated in the concave portion after the bonding process.

However, when the solder paste is filled in the concave portion via the spacer member, the volume of the solder paste filled in the concave portion is substantially increased. Thus, it is possible to securely produce projecting electrodes, each of which has a shape corresponding to the shape of the concave portion. Also, it is possible to control the amount of the solder paste filled in the concave portion by adjusting the thickness of the spacer member.

The objects described above are also achieved by the method for producing a semiconductor device, wherein the electrode material is melted by a heat treatment and a position of the circuit board with respect to the positioning board is determined by a self-alignment effect generated by the electrode material upon melting.

According to the above method for producing a semiconductor device, since the position of the circuit board with respect to the positioning board is determined by a self-alignment effect generated by the electrode material upon melting, it is possible to determine the position of the circuit board with respective to the positioning board readily and securely.

The objects described above are also achieved by the method for producing a semiconductor device, wherein the first positioning portions are positioning holes formed in the positioning board, and the second positioning portions are projecting members, each of which projecting members being engaged with a respective one of the positioning holes.

According to the above method for producing a semiconductor device, the positioning process may be carried out by a simple operation in which the first positioning portions (the positioning holes) are engaged with the corresponding second positioning portions (the projecting members).

The objects described above are also achieved by the method for producing a semiconductor device, wherein the first positioning portions are side surfaces of the positioning board, and the second positioning portions are positioning sides which are formed in the mold and engaged with the side surfaces.

According to the above method for producing a semiconductor device, the positioning process may be carried out by a simple operation in which the first positioning portions (the side surfaces) are engaged with the corresponding second positioning portions (the positioning sides).

The objects described above are also achieved by the method for producing a semiconductor device, wherein the resin is filled in the cavity in the sealing resin forming process in a state that the circuit board is entirely contained in the cavity when the composite board is fixed to the mold, and contact surfaces of the mold contact the positioning board of the composite board.

According to the above method for producing a semiconductor device, the resin is filled in the cavity in the state that the circuit board is entirely contained in the cavity and contact surfaces of the mold contact the positioning board of the composite board. Therefore, the sealing resin covers at least the front surface and the side surfaces of the circuit board. Thus, the circuit board whose positioning accuracy is not sufficient is embedded in the sealing resin which has a higher positioning accuracy, and hence a positioning operation of a semiconductor device may be easily and accurately performed by using the side surfaces of the sealing resin as a standard surface.

The objects described above are also achieved by the method for producing a semiconductor device, wherein the positioning board is selectively removed by an etching process in the positioning board removing process.

According to the above method for producing a semiconductor device, since the positioning board is selectively removed by an etching process, the positioning board may be securely removed and the positioning board removing process may be performed without affecting the other components of the semiconductor device.

The objects described above are also achieved by the method for producing a semiconductor device, wherein the positioning board is peeled off from the circuit board in the positioning board removing process.

According to the above method for producing a semiconductor device, the positioning board which is peeled off from the circuit board may be recycled and the cost for producing the semiconductor device may be reduced.

The objects described above are also achieved by a semiconductor device comprising: a semiconductor element which is mounted on a circuit board; a plurality of projecting electrodes; and a sealing resin, wherein the sealing resin covers at least a front surface and side surfaces of the circuit board, and side surfaces of the sealing resin are positioning surfaces having a high positioning accuracy with respect to the plurality of projecting electrodes.

According to the above semiconductor device, since the side surfaces of the sealing resin are used as the positioning surfaces having a high positioning accuracy with respect to the plurality of projecting electrodes, it is possible carry out the positioning operation for the projecting electrodes with respect to a device to be connected to the projecting electrodes by determining the position of the side surfaces of the sealing resin with respect to the device.

Also, since at least the front surface and the side surfaces of the circuit board are covered by the sealing resin, the circuit board having the lower positioning accuracy is not exposed from the side surfaces of the sealing resin. Thus, the positioning operation of the semiconductor device based on the positioning surfaces may be easily performed.

The objects described above are also achieved by the semiconductor device, wherein the sealing resin also covers a back surface of the circuit board except portions corresponding to the positions of the plurality of projecting electrodes.

According to the above semiconductor device, since the sealing resin is also formed at a back surface of the circuit board except the portions corresponding to the positions of the plurality of projecting electrodes, substantially the entire circuit board is protected by the sealing resin. Thus, for example, if the circuit board is comprised of an organic material having a hydrophilic property, it is possible to prevent the invasion of water into the semiconductor device.

The objects described above are also achieved by the semiconductor device, wherein a single-layer metal film which is made of material(s) different from the material(s) used for the plurality of projecting electrodes is provided on the surface of each of the plurality of projecting electrodes.

The objects described above are also achieved by the semiconductor device, wherein a multi-layer metal film which is made of materials different from the material(s) used for the plurality of projecting electrodes is provided on the surface of each of the plurality of projecting electrodes.

According to the above semiconductor devices, since the single-layer or multi-layer metal film is formed on the surface of each of the plurality of projecting electrodes, it is possible to protect the projecting electrodes. Also, it is possible to improve the bonding property between the projecting electrodes and the metal film by selecting a material which has excellent bonding characteristics with respect to the projecting electrodes for the metal film.

Also, it is possible to improve the bonding property of the metal film with respect to, for instance, a mounting board by selecting a material having an excellent wettability for the metal film.

The objects described above are also achieved by the semiconductor device, wherein the single-layer metal film has higher hardness than the plurality of projecting electrodes.

The objects described above are also achieved by the semiconductor device, wherein the multi-layer metal film has higher hardness than the plurality of projecting electrodes.

According to the above semiconductor device, since the single or the multi-layer metal film is made of material(s) having higher hardness than the plurality of projecting electrodes, the projecting electrodes may be securely protected.

The objects described above are also achieved by the semiconductor device, wherein the plurality of projecting electrodes comprises solder, and the single-layer metal film comprises a material selected from a group consisting of nickel (Ni), nickel-based alloys, chromium (Cr), chromium-based alloys, iron (Fe) and iron-based alloys.

The objects described above are also achieved by the semiconductor device, wherein the plurality of projecting electrodes comprises solder, and the multi-layer metal film comprises at least one material selected from the group consisting of nickel (Ni), nickel-based alloys, chromium (Cr), chromium-based alloys, iron (Fe) and iron-based alloys.

According to the above semiconductor device, since the single or the multi-layer metal film is made of material(s) having higher hardness than the plurality of projecting electrodes, the projecting electrodes may be securely protected.

The objects described above are also achieved by the semiconductor device, wherein the single-layer metal film has a higher wettability than the plurality of projecting electrodes.

The objects described above are also achieved by the semiconductor device, wherein the multi-layer metal film has a higher wettability than the plurality of projecting electrodes.

According to the above semiconductor device, since the single or the multi-layer metal film is made of material(s) having higher wettability compared with that of the plurality of projecting electrodes, the bonding property of the metal film relative to the projecting electrodes may be improved.

The objects described above are also achieved by the semiconductor device, wherein the plurality of projecting electrodes comprises solder, and the single-layer metal film comprises a material selected from a group consisting of tin (Sn), tin-based alloys, gold (Au), gold-based alloys, silver (Ag), silver-based alloys, palladium (Pd) and palladium-based alloys.

The objects described above are also achieved by the semiconductor device, wherein the plurality of projecting electrodes comprises solder, and the multi-layer metal film comprises at least one material selected from a group consisting of tin (Sn), tin-based alloys, gold (Au), gold-based alloys, silver (Ag), silver-based alloys, palladium (Pd) and palladium-based alloys.

According to the above semiconductor device, since the single or the multi-layer metal film is made of material(s) having higher wettability compared with that of the plurality of projecting electrodes, the bonding property of the metal film relative to the projecting electrodes may be improved.

The objects described above are also achieved by the semiconductor device, wherein at least an outermost layer and an innermost layer of the multi-layer metal film are comprised of material(s) having higher wettability than the plurality of projecting electrodes, and middle layer(s) of the multi-layer metal film is/are comprised of material(s) having higher hardness than the plurality of projecting electrodes.

According to the above semiconductor device, it is possible to protect the projecting electrodes and improve the bonding property of the multi-layer metal film with respect to the projecting electrodes and the mounting board, etc.

The objects described above are also achieved by the semiconductor device, wherein the circuit board is comprised of a board selected from a group consisting of a single-layer ceramic board, a multi-layer ceramic board, a glass epoxy board, and a polyimide board.

According to the above semiconductor device, any of the above-mentioned boards may be used for the circuit board according to the present invention.

Other objects and further features of the present invention will be apparent from the following detailed description when read in conjunction with the accompanied drawings.

DESCRIPTION OF THE PREFERRED EMBODIMENTS

A description will be given of embodiments of a semiconductor device and a method for producing the semiconductor device according to the present invention with reference to the accompanied drawings.

Figure 5A:
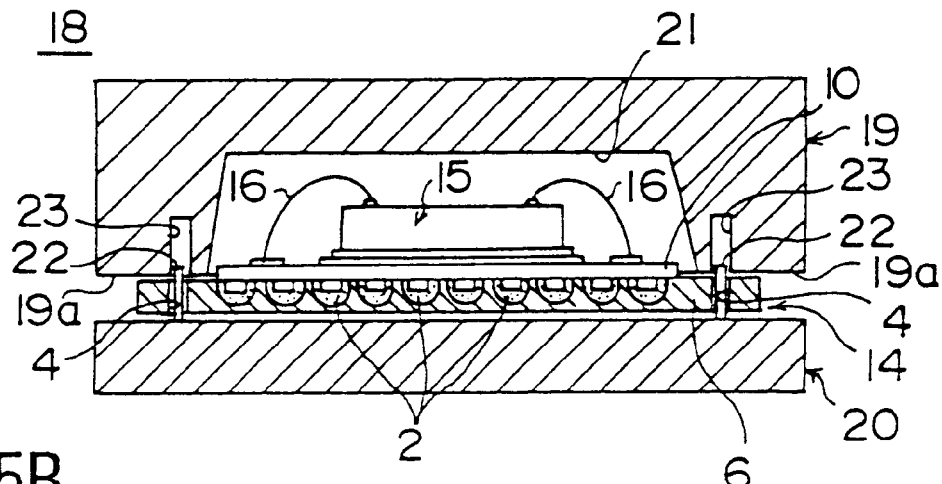
FIG. 5A is a diagram for explaining a sealing resin forming process in the first embodiment according to the present invention.
Figure 5B:
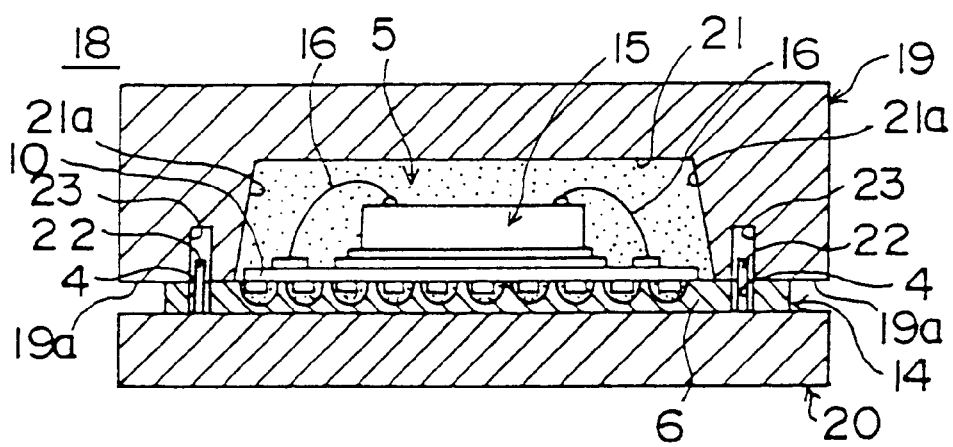
FIG. 5B is a diagram for explaining the sealing resin forming process in the first embodiment according to the present invention.
Figure 5C:
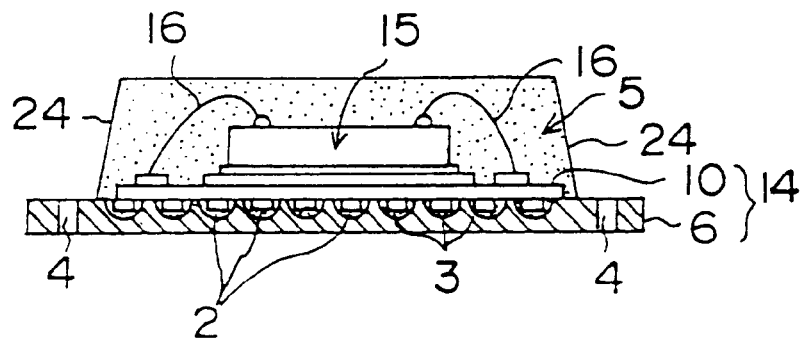
FIG. 5C is a diagram for explaining the sealing resin forming process in the first embodiment according to the present invention.
Figure 6:
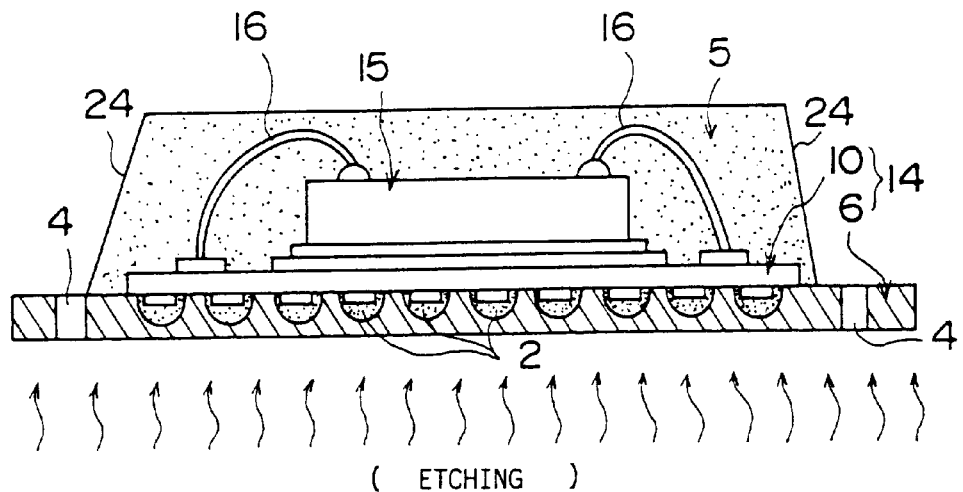
FIG. 6 is a diagram for explaining a positioning board removing process in the first embodiment according to the present invention.
Figure 7:
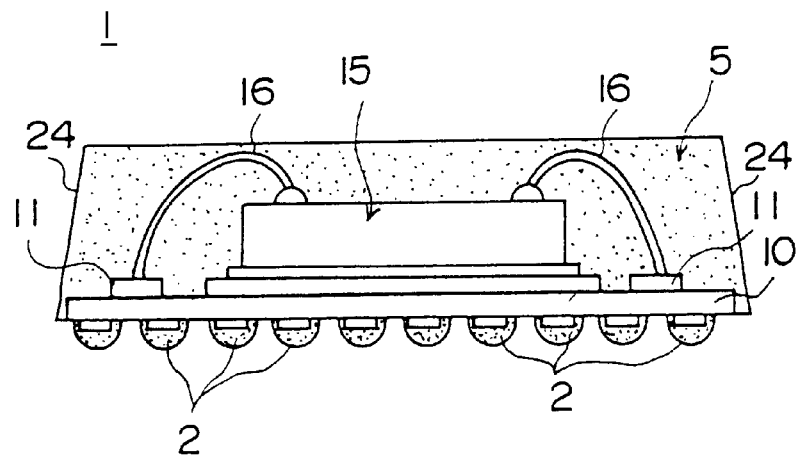
FIG. 7 is a diagram showing a semiconductor device produced by a method for producing a semiconductor device according to the first embodiment of the present invention.

FIGS. 1 through 6 are diagrams for explaining a method for producing the semiconductor device according to a first embodiment of the present invention. FIG. 7 is a diagram showing a semiconductor device 1 produced by using the above method according to the first embodiment of the present invention. Hereinafter, the method for producing the semiconductor device 1 will be explained using FIGS. 1 through 6.

Figure 1:
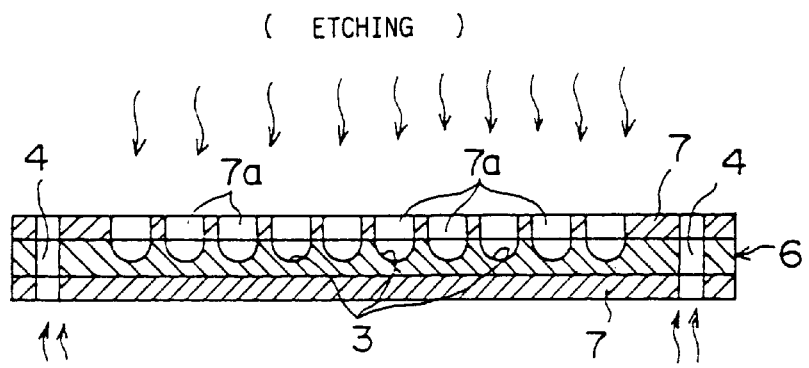
FIG. 1 is a diagram for explaining a positioning board forming process in a first embodiment according to the-present invention.

FIG. 1 is a diagram for explaining a positioning board forming process according to the method for producing the semiconductor device of the present invention. In the process for forming the positioning board, concave portions 3 and positioning holes 4 (i.e., first positioning portions) are formed in a flat-plate member made of copper (Cu). The concave portions 3 are accurately formed so as to correspond to the predetermined position of solder bumps 2 (i.e., projecting electrodes). The positioning holes 4 are used to determine the position of sealing resin 5 with respect to the solder bumps 2 in a sealing resin forming process (to be described later).

Here, the positioning board forming process will be explained in detail. The process may be divided into four steps—a resist application step, a mask forming step, an etching step and a mask removing step. In the resist application step, photoresist is applied on both sides of the above-mentioned flat-plate member which becomes a positioning board 6.

In the mask forming step, a mask 7 is formed by forming openings 7a in the photoresist layer using a thin-film forming technique such as photolithography at positions corresponding to the above-mentioned predetermined positions of the solder bumps 2 and the positioning holes 4.

In the etching step, an etching operation is carried out using the mask 7 so that the concave portions 3 and the positioning holes 4 are formed in the flat-plate member (FIG. 1 shows this etching step). Then, in the mask removing step, the mask 7 is removed and the positioning board 6 is formed.

As mentioned above, since the concave portions 3 and the positioning holes 4 are formed using the thin-film forming technique such as the resist application step, the mask forming step, the etching step and the mask removing step in the positioning board forming process according to the present invention, it is possible to improve the formation accuracy of the concave portions 3 and the positioning holes 4. Also, since the concave portions 3 and the positioning holes 4 are simultaneously formed in the positioning board 6 using the same mask 7, the positioning accuracy of the concave portions 3 and the positioning holes 4 with respect to each other may be significantly increased.

Figure 2A:
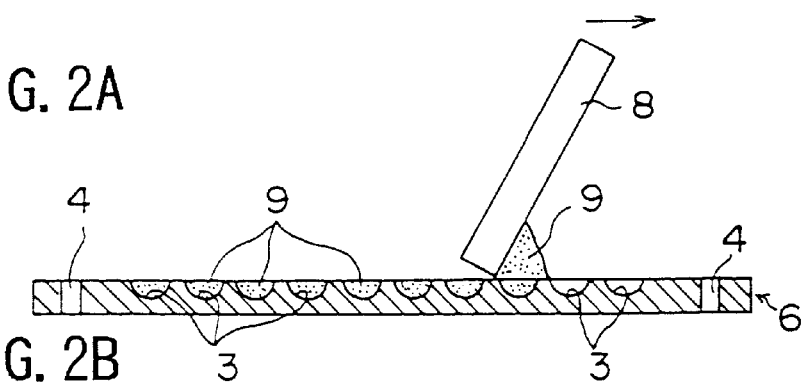
FIG. 2A is a diagram for explaining a filling process in the first embodiment according to the present invention.
Figure 2B:
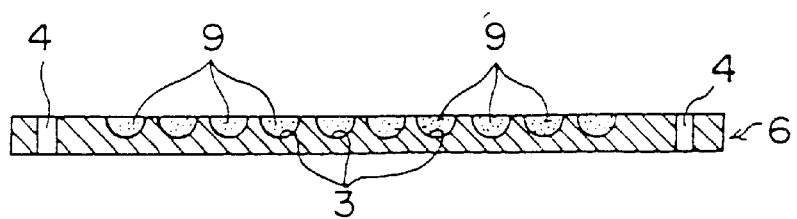
FIG. 2B is a diagram for explaining the filling process in the first embodiment according to the present invention.

After the above-explained positioning board forming process, a filling process as shown in FIGS. 2A and 2B is carried out. In the filling process, an electrode material (solder paste 9 in this embodiment) for the solder bumps 2 is filled in the concave portions 3 formed in the positioning board. In the filling process of this embodiment, the solder paste 9 is filled in the concave portions 3 using a squeegee 8 as shown in FIG. 2A.

When the solder paste 9 is used as an electrode material as above and the paste 9 is filled in the concave portions 3 formed in the positioning board 6 using the squeegee 8, it becomes possible to fill the solder paste 9 in the concave portions 3 in the same manner as a so-called thick-film printing technique. Thus, the solder paste 9 may be filled in the concave portions 3 easily and firmly. Note that the state in which the solder paste 9 is filled in all of the concave portions 3 is shown in FIG. 2B.

Figure 3A:
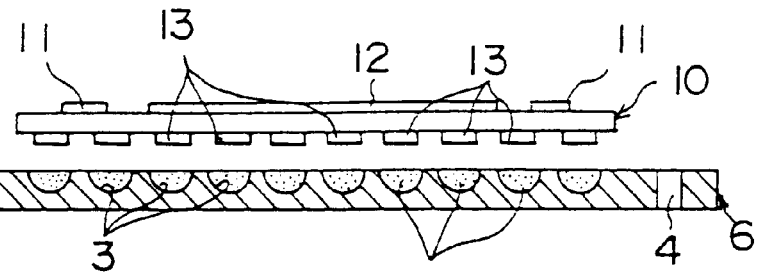
FIG. 3A is a diagram for explaining a bonding process in the first embodiment according to the present invention.
Figure 3B:
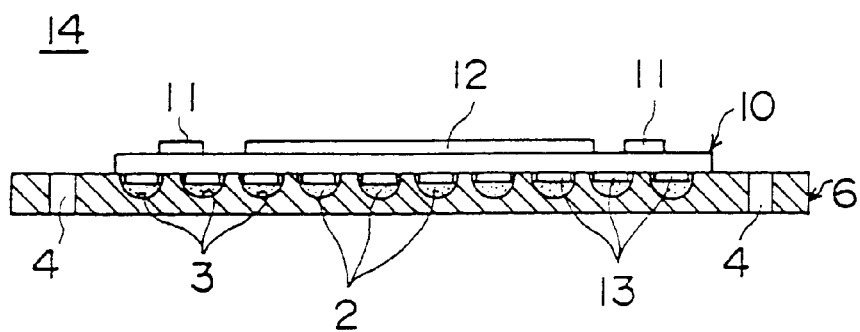
FIG. 3B is a diagram for explaining the bonding process in the first embodiment according to the present invention.

After the completion of the above-mentioned filling process, a bonding process is carried out. This is shown in FIGS. 3A and 3B. In the bonding process, a circuit board 10 on which a semiconductor element 15 to be mounted is bonded to the positioning board 6 via the solder paste 9 which is heated and melted. In this manner, a composite board 14 in which the circuit board 10 and the positioning board 6 are combined is formed.

When the composite board 14 is formed, each of the solder paste 9 in the respective concave portions 3 are connected to a respective bump side electrode 13 formed on the back surface of the circuit board 10 so as to form a solder bump 2. Each of the solder bumps 2 is positioned so as to correspond to the respective concave portions 3 formed in the positioning board 6 and its shape is hemispherical corresponding to the shape of the concave portions 3.

Since the position of each of the solder paste 9 is determined by the positioning board 6 and it is directly transferred to the circuit board 10, it is possible to accurately form the solder bumps 2 at a respective predetermined position regardless of the accuracy of the circuit board 10.

Each of the solder paste 9 is melted during a heating treatment in the bonding process and the position of the circuit board 10 with respect to the positioning board 6 is determined automatically due to the self-alignment effect generated when the solder paste 9 is melted. As shown in FIG. 3A, a reasonable accuracy is required when the position of the circuit board 10 on the positioning board 6 is determined. In this embodiment, the positioning of the circuit board 10 on the positioning board 6 is carried out by using an image recognition technique.

Figure 4:
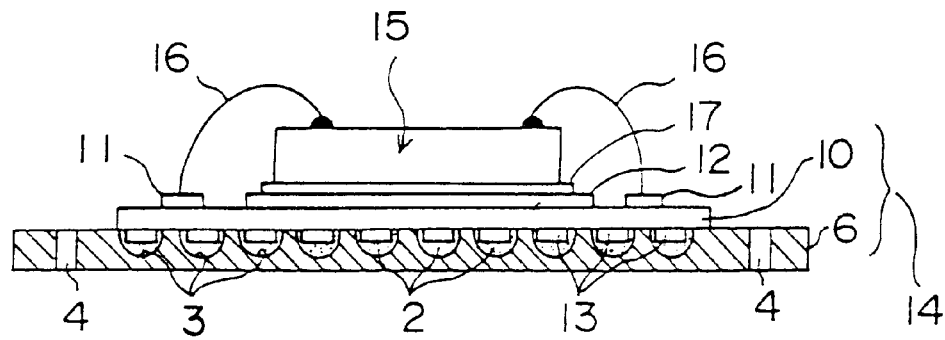
FIG. 4 is a diagram for explaining an element mounting process in the first embodiment according to the present invention.

After the composite board 14 is formed in the bonding process, an element mounting process is performed. FIG. 4 is a diagram for explaining the element mounting process.

When a semiconductor element 15 is mounted on the circuit board 10, the semiconductor element 15 is fixed to an element mounting portion 12 which is formed on the circuit board 10 using an adhesive composition 17 and then the semiconductor element 15 is electrically connected to pads 11 which are also formed on the circuit board 10. In this embodiment, although the wire-bonding method by which the semiconductor element 15 is electrically connected to the circuit board 10 by wires 16 is employed, it is possible to use the flip-chip connecting method.

After the element mounting process, a sealing resin forming process is conducted. FIGS. 5A through 5C are diagrams for explaining the sealing resin forming process.

In the sealing resin forming process, a sealing resin 5 which is used for covering the semiconductor element 15 and the wires 16 is formed by using a mold 18. The mold 18 is comprised of an upper portion 19 and a lower portion 20.

A cavity 21 for forming the sealing resin 5 and positioning concave portions 23 for determining the position of the upper portion 19 with respect to the lower portion 20 is provided with the upper portion 19. On the other hand, positioning pins 22 which determine the position of the positioning board 6 with respect to the cavity 21 are provided with the lower portion 20 of the mold 18. The positioning pins 22 and the positioning concave portions 23 form a first positioning means according to the present invention.

When the composite board 14 is fixed to the mold 18, each of the positioning pins 22 of the lower portion 20 is inserted in the respective positioning hole 4 formed in the positioning board 6. In this state, the positioning pins 22 and the positioning holes 4 are engaged and the position of the positioning board 6 of the composite board 14 is determined with respect to the lower portion 20 of the mold 18.

Then, the upper portion 19 is fixed to the lower portion 20 by engaging each of the positioning concave portions 23 with the respective positioning pins 22. In this manner, the position of the upper portion 29 is determined with respect to the lower portion 20, and hence to the positioning board 6 of the composite board 14.

That is, when the composite board 14 is fixed to the mold 18, the position of the positioning board 6 may be determined with high accuracy with respect to the upper portion 19 and the lower portion 20 by engaging the positioning holes 4, the positioning pins 22 and the positioning concave portions 23. Note that no function is provided with the circuit board 10 to determine the position of the composite board 14 with respect to the mold 18.

Also, when the positioning holes 4, the positioning pins 22 and the positioning concave portions 23 are engaged as above, the position of the cavity 21 may be determined with high accuracy with respect to the positioning board 6. On the other hand, after the above-mentioned positioning board forming process and the bonding process, the solder bumps 2 are formed on the circuit board 10 in a state that their positions are determined by the positioning board 6.

Thus, when the composite board 14 is fixed to the mold 18, the position of the solder bumps 2 with respective to the cavity 21 may also be determined with high accuracy. That is, the positions of the solder bumps 2 relative to the cavity 21 may be accurately defined regardless of the circuit board 10.

Moreover, when the composite board 14 is fixed in the mold 18, the circuit board 10 is completely contained in the cavity 21. Thus, a contacting surface 19a of the upper portion 19 contacts only the positioning board 6 of the composite board 14. As mentioned above, a resin is filled in the cavity 21 so as to form the sealing resin 5 after the composite board 14 is fixed to the mold 18. This is shown in FIG. 5B. After the formation of the sealing resin 5, the mold 18 is removed from the composite board 14 and the composite board 14 including the sealing resin 5 as shown in FIG. 5C is formed.

As for the positional relationship between the sealing resin 5 and the solder bumps 2, since the position of each of the solder bumps 2 is accurately determined with respect to the cavity 21 when the composite board 14 is fixed to the mold 18, the position of the sealing resin 5 which is formed by the cavity 21 may also be accurately determined with respective to the solder bumps 2.

Thus, it becomes possible to determine the position of the solder bumps 2 based on the position of side surfaces 24 (hereinafter also referred to as a standard surface 24) of the sealing resin 5, whose position may be defined by an inner side surface 21a of the cavity 21. Therefore, the position of the solder bumps 2 may be detected using the standard surface 24 when the semiconductor device 1 is mounted on a mounting board or an IC socket, and hence the position of the semiconductor device 1 may be determined with high accuracy.

Also, since the circuit board 10 is completely contained in the cavity 21 and the filling operation of the resin is carried out in the state that the contacting surface 19a of the upper portion 19 is in contact with the positioning board 6 as mentioned above, the sealing resin 5 covers at least the entire surfaces of the circuit board 10.

That is, the circuit board 10, whose position is difficult to be determined, is completely embedded in the sealing resin 5 whose position may be determined with high accuracy as mentioned above. Thus, the position determination operation for the semiconductor device 1 may be easily carried out using the standard surface 24.

After the above-mentioned sealing resin forming process, a positioning board removing process in which the positioning board 6 is removed is conducted. In the positioning board removing process, the positioning board 6 is selectively removed by an etching process as shown in FIG. 6. As shown in the figure, it becomes possible to remove the positioning board 6 without affecting the other components of the semiconductor device 1 by selectively removing the positioning board 6 using the etching process.

Note that the method for removing the positioning board 6 is not limited to the etching process and the positioning board 6 may be peeled off from the circuit board 10 by pulling the board 6 at normal temperature. In this manner, the positioning board 6 may be recycled and the cost for producing the semiconductor device 1 may be reduced. In addition, when the above method is used, it is preferable to apply a separation enhancing agent, which facilitates separation of the positioning board 6 from the solder bumps 2, in the concave portions 3. This procedure may be performed between the positioning board forming process shown in FIG. 1 and the filling process shown in FIG. 2.

After the above-explained processes, the semiconductor device 1 shown in FIG. 7 is produced. Since the position of the solder bumps 2 may be determined using the side surfaces (standard surface) 24 of the sealing resin 5, the position of the semiconductor device 1 may be determined with high accuracy.

In a conventional semiconductor device, when a ceramic material, for instance, is used for the circuit board, the difference in size (tolerance) between the ceramic board and the bump side electrode exceeds 300 $\mu$m and the board tolerance exceeds 400 $\mu$m. Therefore, if the position of the solder bumps 2 are determined based on the circuit board, a large dimensional error is caused and, hence, the positional accuracy is lowered.

In the semiconductor device 1 produced as above according to the present invention, on the other hand, the positional shift between each of the concave portions 3 and the respective positioning hole 4 is a maximum of 20 $\mu$m and the positional shift between the positioning hole 4 and the mold 18 is a maximum of 60 $\mu$m. Moreover, the dimensional error of the mold 18 may be reduced to less than 50 $\mu$m. Further, the positional accuracy which may be obtained in accordance with the present invention is not affected by the materials used for the circuit board 10. For this reason, according to the present invention, various kinds of materials, such as a ceramic, glass epoxy and polyimide may be used for the circuit board 10.

Figure 8A:
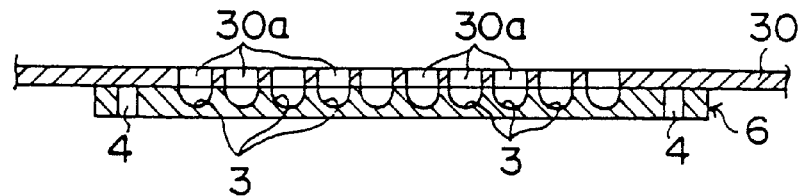
FIG. 8A is a diagram for explaining a filling process in a second embodiment according to the present invention.
Figure 8B:
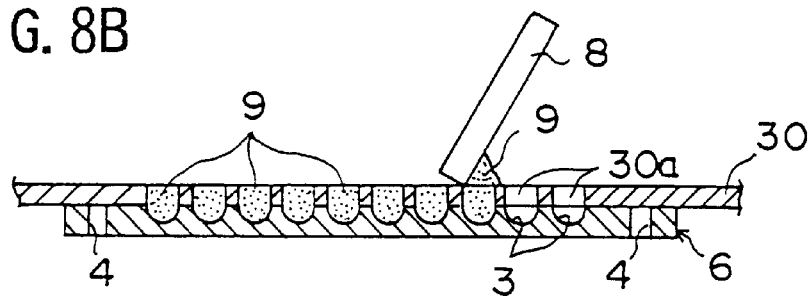
FIG. 8B is a diagram for explaining the filling process in the second embodiment according to the present invention.
Figure 9:
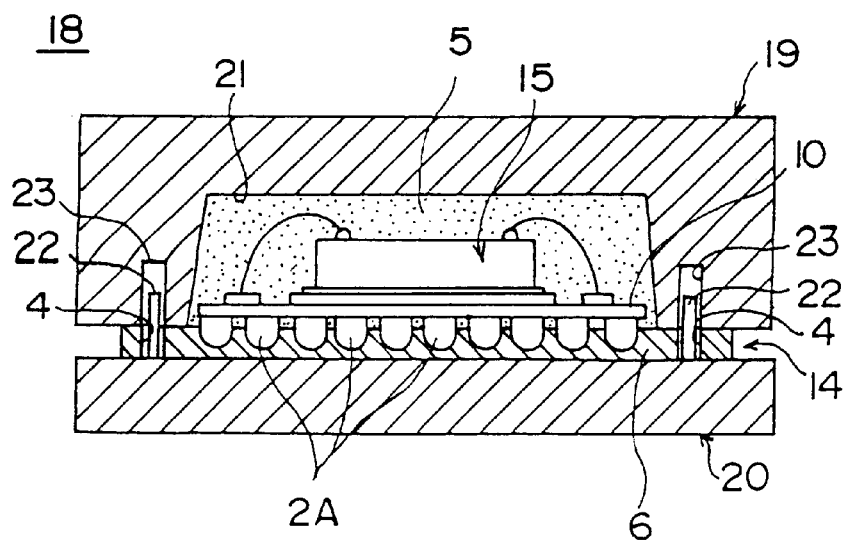
FIG. 9 is a diagram for explaining a sealing resin forming process in the second embodiment according to the present invention.
Figure 10:
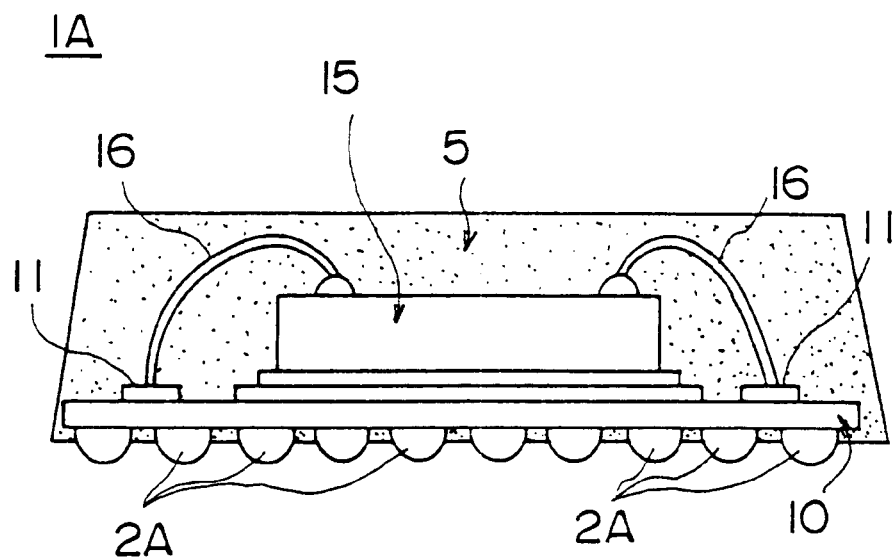
FIG. 10 is a diagram showing a semiconductor device produced by a method for producing a semiconductor device according to the second embodiment of the present invention.

Next, a method for producing a semiconductor device according to a second embodiment of the present invention will be explained with reference to FIGS. 8 through 10. FIGS. 8A and 8B are diagrams for explaining a filling process used in the second embodiment of the method for producing the semiconductor device. FIG. 9 is a diagram for explaining a sealing resin forming process and FIG. 10 is a diagram for showing a semiconductor device 1A produced by the method according to the second embodiment of the present invention. Note that the processes of the second embodiment which are substantially the same as the ones in the first embodiment are not shown in the drawings and the explanation thereof will be omitted. Also, elements which are the same as the ones in the first embodiment are indicated by the same reference numerals.

In FIGS. 8A and 8B, the filling process in accordance with the second embodiment of the present invention is shown. The filling process is characterized by the presence of a mask 30 (a spacer member) having a plurality of openings 30a, each of which is located at a position corresponding to the position of a corresponding concave portion 3. The mask 30 is provided before the solder paste 9 is filled in the concave portions 3 formed in the positioning board 6 using the squeegee 8. Thus, the solder paste 9 is filled in the concave portions 3 via the mask 30.

As mentioned above, since the solder paste 9 is filled in the space formed by the respective concave portion 3 and the mask 30, a larger volume of solder paste 9, compared with the volume of the solder paste used in the first embodiment, may be filled in the positioning board 6.

The solder paste 9 is comprised of, for instance, organic flux in which solder particles are present. When the solder paste 9 is heated in the bonding process, the flux is evaporated and the volume of the solder paste 9 is reduced. Thus, according to the method used in the first embodiment, there is a danger that a space or a void is generated in the concave portion 3 after the bonding process.

In the second embodiment of the present invention, however, the solder paste 9 is filled in the concave portion 3 via the mask 30 so as to substantially increase the volume of the solder paste filled in the concave portion 3. Thus, it is possible to securely produce solder bumps 2A, each of which has a shape corresponding to the shape of the concave portion 3.

Also, it is possible to control the filling amount of the solder paste 9 in the concave portion 3 by adjusting the thickness of the mask 30. Therefore, the height of the solder bumps 2A may be adjusted by the thickness of the mask 30.

FIG. 9 shows the sealing resin forming process in which the height of the solder bumps 2A are set to be higher than that of the solder bumps 2 in the first embodiment. Since the height of the solder bumps 2A is set to be higher, voids are formed between the positioning board 6 and the circuit board 10 when the composite board 14 is formed. Thus, the sealing resin 5 is provided at the back of the circuit board 10 as shown in FIG. 9 when the composite board 14 having the above-mentioned structure is fixed to the mold 18 and the resin is filled.

FIG. 10 is a diagram showing a semiconductor device 1A which is produced via the sealing resin forming process shown in FIG. 9. The semiconductor device 1A shown in FIG. 10 has a structure in which the sealing resin 5 is also formed at the back of the circuit board 10 except the portions corresponding to the positions of the solder bumps 2A. Thus, the entire circuit board 10 is substantially protected by the sealing resin, and hence if the circuit board 10 is made of an organic material having a hydrophilic property, it is possible to prevent the invasion of water (moisture) into the semiconductor device 1A. In this manner, the reliability of the semiconductor device 1A may be improved.

Figure 11:
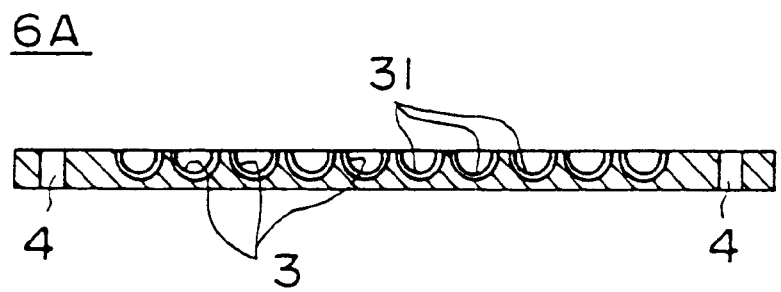
FIG. 11 is a diagram for explaining a positioning board forming process in a third embodiment according to the present invention.

Next, a method for producing a semiconductor device according to a third embodiment of the present invention will be explained with reference to FIGS. 11 and 12. FIG. 11 is a diagram for explaining a positioning board forming process according to the third embodiment of the present invention and FIGS. 12A through 12C are diagrams showing a cross section of a solder bump produced by the third embodiment in a magnified scale. Note that the processes of the third embodiment which are substantially the same as the ones in the first embodiment are not shown in the drawings and the explanation thereof will be omitted. Also, elements which are the same as the ones in the first embodiment are indicated by the same reference numerals.

In FIG. 11, a metal-film-of-different-materials forming process carried out in this embodiment is shown. The metal-film-of-different-materials forming process is performed after the positioning board forming process and before the filling process. In the metal-film-of-different-materials forming process, a single-layer or a multiple-layer of a metal-film-of-different-materials 31 comprised of different materials from the materials used for the solder bumps 2 is formed in the concave portions 3 of a positioning board 6A.

By performing the metal-film-of-different-materials forming process after the positioning board forming process and before the filling process, a metal-film-of-different-materials 31 may be formed on the surface of the solder bumps 2 when the positional board removing process, in which the positional board 6A is removed, is completed.

Next, a practical structure of the metal-film-of-different-materials 31 will be explained. The metal-film-of-different-materials 31 is comprised of a single-layer or a multi-layer metal film which is formed of different materials used for the solder bumps 2. FIG. 12A through 12C are diagrams showing a variation of the metal-film-of-different-materials 31.

Figure 12A:
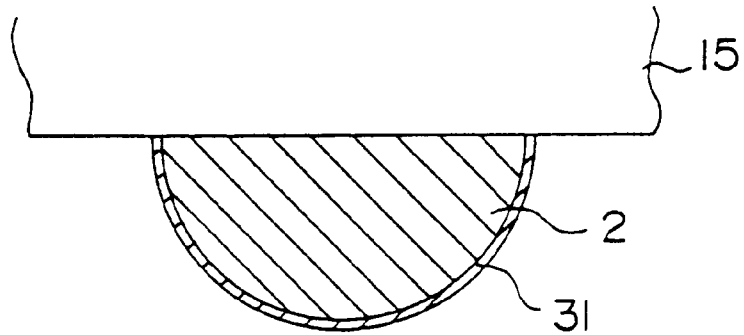
FIG. 12A is a diagram showing a cross-sectional view of a solder bump in a magnified scale which is formed according to the third embodiment of the present invention.

FIG. 12A is a diagram showing a single-layer type metal-film-of-different-materials 31 which is formed on the surface of the solder bump 2. Examples of the material which may be used for the metal-film-of-different-materials 31 include one having higher hardness than that of the solder bump 2 such as nickel (Ni), nickel-based alloys, chromium (Cr), chromium-based alloys, iron (Fe) and iron-based alloys.

Also, materials having higher wettability than the solder bump 2 (i.e., solder) may be used as the metal-film-of-different-materials 31. In such a case, tin (Sn), tin-based alloys, gold (Au), gold-based alloys, silver (Ag), silver-based alloys, palladium (Pd) and palladium-based alloys, etc., may be used for the metal-film-of-different-materials 31.

As mentioned above, it is possible to improve bonding between the solder bump 2 and the metal-film-of-different-materials 31, and between the metal-film-of-different-materials 31 and the mounting board by choosing a material having a good bonding property with the solder as a material for the metal film 31. Moreover, it becomes possible to securely protect the solder bump 2 by using a material having higher hardness than that of the solder bump 2 for the metal-film-of-different-materials 31.

Figure 12B:
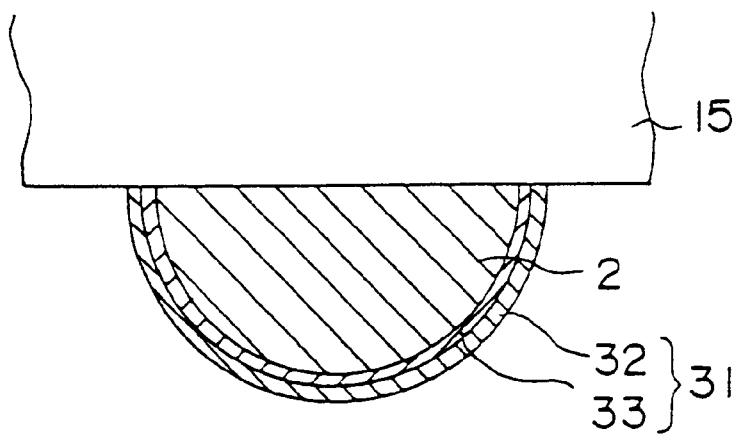
FIG. 12B is a diagram showing a cross-sectional view of a solder bump in a magnified scale which is formed according to the third embodiment of the present invention.

FIG. 12B is a diagram showing a multi-layer metal-film-of-different-materials 31 comprising a plurality of metal films 32 and 33. FIG. 12C is a diagram showing a multi-layer metal-film-of-different-materials 31 comprising a plurality of metal films 34, 35 and 36. In FIG. 12B, the metal-film-of-different-materials 31 is comprised of an outer layer 32 and an inner layer 33. In FIG. 12C, the metal-film-of-different-materials 31 is comprised of an outer layer 34, a middle layer 35 and an inner layer 36.

Figure 12C:
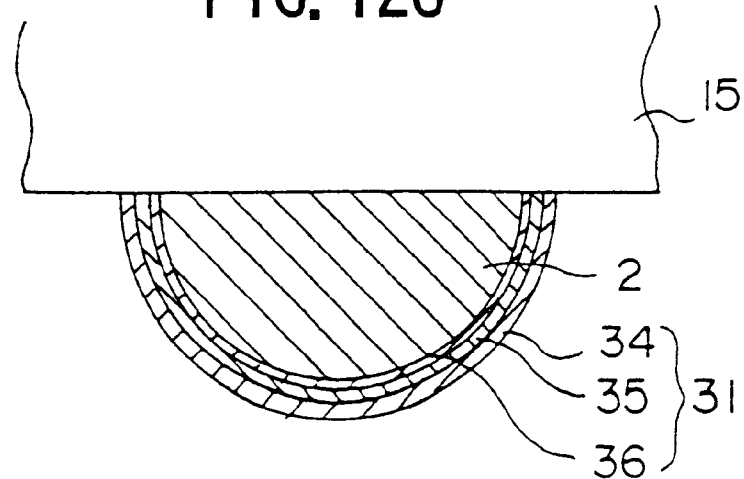
FIG. 12C is a diagram showing a cross-sectional view of a solder bump in a magnified scale which is formed according to the third embodiment of the present invention.

In the metal film layer 31 shown in FIG. 12B and 12C, at least the outer layers 32 and 34 and the inner layers 33 and 36 are formed of material(s) having higher wettability than the solder bump 2 (i.e., solder). Also, the middle layer 35 between the outer layer 34 and the inner layer 36 is formed of a material having higher hardness than the solder bump 2.

According to the above-mentioned structure of the metal film layer 31 in which at least the outer layers 32 and 34 and the inner layers 33 and 36 are formed of material(s) having higher wettability than the solder bump 2 and the middle layer 35 between the outer layer 34 and the inner layer 36 is formed of a material having higher hardness than the solder bump 2, it is possible to improve the protection of the solder bump 2, the bonding characteristics between the metal-film-of-different-materials 31 and the solder bump 2, and the bonding property between the metal-film-of-different-materials 31 and the mounting board, etc.

Although a case in which the positioning holes 4 formed in the positioning board 6 are the first positioning portions is explained in the above embodiment, the first positioning portions are not limited to the positioning holes 4 and, for example, a side of the positioning board 6 may be used as the first positioning portion. In that case, a positioning side which is engaged with the above-mentioned side of the positioning board 6 and determines its position may be formed in the mold 18. The positioning side of the above is defined as a second positioning portion.

It is understood that the present invention is not limited to these embodiments, and variations and modifications may be made without departing from the scope of the present invention.

What is claimed is:

1. A method for producing a semiconductor device comprising:
   a) a positioning board forming process in which concave portions, each of which is located at a position corresponding to a position of a respective projecting electrode of a semiconductor device, and first positioning portions, which are used for determining a position of a sealing resin with respect to said projecting electrode, are integrally formed on a flat-plate member so as to form a positioning board;
   b) a filling process in which an electrode material for forming said projecting electrode is filled in said concave portions formed on said positioning board;
   c) a bonding process in which a composite board is formed by mounting a circuit board on said positioning board so as to bond each of said electrode material filled in said concave portions to said circuit board;
   d) a sealing resin forming process in which a mold having a cavity for forming a sealing resin and second positioning portions for determining a position of said positioning board with respect to said cavity is fixed to said composite board in a state that the position of said positioning board is determined with respect to said cavity by engaging said first positioning portions with respective said second positioning portions, and resin is filled in said cavity so as to form said sealing resin, and
   e) a positioning board removing process in which said positioning board is removed.

2. The method for producing a semiconductor device as claimed in claim 1 further comprising:
   a metal-film-of-different-materials forming process, which is performed after said positioning board forming process and before said filling process, in which a single-layer metal film made of material(s) different from the material(s) used for said projecting electrodes is formed in said concave portions.

3. The method for producing a semiconductor device as claimed in claim 1 further comprising:
   a metal-film-of-different-materials forming process, which is performed after said positioning board forming process and before said filling process, in which a multi-layer metal film formed of materials different from the material(s) used for said projecting electrode is formed in said concave portions.

4. The method for producing a semiconductor device as claimed in claim 1,
   wherein solder paste is used for said electrode material and said solder paste is filled in said concave portions using a squeegee in said filling process, and
   when said solder paste is filled in said concave portions using said squeegee, a spacer member having openings, each of which is located at a position corresponding to the position of a respective one of said concave portions, is provided on said positioning board and said solder paste is filled in said concave portions via said spacer member.

5. The method for producing a semiconductor device as claimed in claim 1,
   wherein said electrode material is melted by a heat treatment and a position of said circuit board with respect to said positioning board is determined by a self-alignment effect generated by said electrode material upon melting.

6. The method for producing a semiconductor device as claimed in claim 1,
   wherein said first positioning portions are positioning holes formed in said positioning board, and
   said second positioning portions are projecting members, each of which projecting members being engaged with a respective one of said positioning holes.

7. The method for producing a semiconductor device as claimed in claim 1,
   wherein said first positioning portions are side surfaces of said positioning board, and
   said second positioning portions are positioning sides which are formed in said mold and engaged with said side surfaces.

8. The method for producing a semiconductor device as claimed in claim 1,
   wherein said resin is filled in said cavity in said sealing resin forming process in a state that said circuit board is entirely contained in said cavity when said composite board is fixed to said mold, and contact surfaces of said mold contact said positioning board of said composite board.

9. The method for producing a semiconductor device as claimed in claim 1,
   wherein said positioning board is selectively removed by an etching process in said positioning board removing process.

10. The method for producing a semiconductor device as claimed in claim 1,
    wherein said positioning board is peeled off from said circuit board in said positioning board removing process.

* * * * *